(12) United States Patent
Wang et al.

(10) Patent No.: US 12,495,575 B2
(45) Date of Patent: Dec. 9, 2025

(54) MULTI-CHANNEL REPLACEMENT METAL GATE DEVICE

(71) Applicant: GLOBALFOUNDRIES U.S. Inc., Malta, NY (US)

(72) Inventors: Haiting Wang, Clifton Park, NY (US); Hong Yu, Clifton Park, NY (US); Zhenyu Hu, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 737 days.

(21) Appl. No.: 17/830,678

(22) Filed: Jun. 2, 2022

(65) Prior Publication Data

US 2023/0395715 A1 Dec. 7, 2023

(51) Int. Cl.
| | |
|---|---|
| *H01L 29/78* | (2006.01) |
| *H01L 29/08* | (2006.01) |
| *H01L 29/66* | (2006.01) |
| *H10D 30/01* | (2025.01) |
| *H10D 30/62* | (2025.01) |
| *H10D 30/63* | (2025.01) |
| *H10D 62/13* | (2025.01) |

(52) U.S. Cl.
CPC ......... *H10D 30/637* (2025.01); *H10D 30/024* (2025.01); *H10D 30/62* (2025.01); *H10D 62/151* (2025.01)

(58) Field of Classification Search
CPC .. H10D 30/024; H10D 30/62; H10D 84/0158; H10D 84/0193; H10D 84/038; H10D 84/834; H10D 84/853; H10D 86/011; H10D 86/215; H10D 30/637; H10D 62/151; H01L 29/7838; H01L 29/0847; H01L 29/66795; H01L 29/785
USPC .......................................................... 257/348
See application file for complete search history.

(56) References Cited

U.S. PATENT DOCUMENTS

| | | | | |
|---|---|---|---|---|
| 5,120,666 A | * | 6/1992 | Gotou ................. | H10D 30/673 438/164 |
| 7,071,064 B2 | | 7/2006 | Doyle et al. | |
| 7,300,837 B2 | | 11/2007 | Chen et al. | |

(Continued)

FOREIGN PATENT DOCUMENTS

| | | | | | |
|---|---|---|---|---|---|
| CN | 103794512 A | * | 5/2014 | ....... | H01L 21/28017 |
| CN | 108288642 A | * | 7/2018 | ........... | H10D 30/711 |

(Continued)

OTHER PUBLICATIONS

Machine translation, Guo, Chinese Pat. Pub. No. CN114420566A, translation date: Jan. 25, 2025, Espacenet, all pages. (Year: 2025).*

(Continued)

*Primary Examiner* — Victoria K. Hall
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a multi-channel replacement metal gate device and methods of manufacture. The structure includes: a fully depleted semiconductor on insulator substrate; a plurality of fin structures over the fully depleted semiconductor on insulator substrate; and a metal gate structure spanning over the plurality of fin structures and the fully depleted semiconductor on insulator substrate.

14 Claims, 19 Drawing Sheets

(56) References Cited

U.S. PATENT DOCUMENTS

| | | | | |
|---|---|---|---|---|
| 7,372,086 | B2* | 5/2008 | Sato | H10D 30/6734 |
| | | | | 257/E29.264 |
| 9,379,135 | B2* | 6/2016 | Cheng | H10D 86/011 |
| 9,431,301 | B1* | 8/2016 | Chu | H10D 64/017 |
| 9,525,069 | B2* | 12/2016 | Bryant | H10D 62/115 |
| 9,680,020 | B2* | 6/2017 | Basker | H01L 21/31111 |
| 10,056,408 | B2* | 8/2018 | Bryant | H10D 64/691 |
| 10,388,790 | B2* | 8/2019 | Chi | H10D 84/0151 |
| 10,438,858 | B2 | 10/2019 | Bedell et al. | |
| 2004/0217420 | A1 | 11/2004 | Yeo et al. | |
| 2004/0251487 | A1* | 12/2004 | Wu | H10B 43/30 |
| | | | | 257/E21.679 |
| 2007/0132009 | A1* | 6/2007 | Takeuchi | H01L 29/41791 |
| | | | | 257/E21.438 |
| 2008/0237695 | A1* | 10/2008 | Shino | H10D 30/69 |
| | | | | 257/E21.21 |
| 2016/0314839 | A1* | 10/2016 | Hsu | H01L 29/40117 |
| 2021/0167182 | A1* | 6/2021 | Sung | H10D 84/038 |

FOREIGN PATENT DOCUMENTS

| | | | | |
|---|---|---|---|---|
| CN | 111403469 A | * | 7/2020 | H10D 30/023 |
| CN | 113178489 | | 7/2021 | |
| CN | 114420566 A | * | 4/2022 | H10D 30/024 |
| DE | 102020126638 | | 10/2021 | |
| EP | 3249689 | | 11/2017 | |
| JP | 2008288567 A | * | 11/2008 | H01L 21/762 |
| WO | WO-2005074036 A1 | * | 8/2005 | H10D 30/6706 |

OTHER PUBLICATIONS

Machine translation, Wang, Chinese Pat. Pub. No. CN111403469A, translation date: Jan. 16, 2025, Espacenet, all pages. (Year : 2025).*
Machine translation, Nakajima, Japanese Pat. Pub. No. JP-2008288567-A, Espacenet, translation date: Jun. 25, 2025, all pages. (Year: 2025).*
Machine translation, Koh, WIPO Pat. Pub. No. WO-2005074036-A1, Clarivate Analytics, translation date: Jun. 25, 2025, all pages. (Year: 2025).*
Machine translation, Zhang, Chinese Pat. Pub. No. CN-108288642-A, Clarivate Analytics, translation date: Jun. 25, 2025, all pages. (Year: 2025).*
Machine translation, Kang, Chinese Pat. Pub. No. CN-103794512-A, Clarivate Analytics, translation date: Jun. 25, 2025, all pages. (Year: 2025).*
German Office Action dated Mar. 15, 2024 in German Application No. 10 2023 111 183.3, with Google Machine English Translation, 6 pages.

* cited by examiner

MULTI-CHANNEL REPLACEMENT METAL GATE DEVICE

BACKGROUND

The present disclosure relates to semiconductor structures and, more particularly, to a multi-channel replacement metal gate device and methods of manufacture.

Fully Depleted Silicon-On-Insulator (FDSOI) technology is a planar architecture that delivers benefits of reduced silicon geometries while also simplifying the manufacturing process. FDSOI technology also enables improved control of the behavior of the transistor through the gate and by polarizing the substrate underneath the device. FDSOI with planar architecture, though, has significant challenges to meet higher performance and higher drivability, with difficult scaling down to smaller technology nodes. For example, planar architectures exhibit less Weff (channel width) for current drive.

SUMMARY

In an aspect of the disclosure, a structure comprises: a semiconductor on insulator substrate; a plurality of fin structures over the semiconductor on insulator substrate; and a metal gate structure spanning over the plurality of fin structures and the semiconductor on insulator substrate.

In an aspect of the disclosure, a structure comprises a multi-channel transistor with multiple pillar channel regions above a semiconductor on insulator channel region.

In an aspect of the disclosure, a method comprises: forming a plurality of fin structures over semiconductor on insulator substrate; and forming a metal gate structure spanning over the plurality of fin structures and the semiconductor on insulator substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a multi-channel replacement metal gate device and methods of manufacture. More specifically, the present disclosure relates to a multi-channel fully depleted semiconductor on insulator (FDSOI) replacement metal gate device with fin structures and methods of manufacture. Advantageously, the present disclosure extends the FDSOI platform to meet RF and system on chip (SoC) requirements, with significant current drive and device performance boost.

In more specific embodiments, the multi-channel replacement metal gate device comprises a FDSOI substrate, with standing gate-all-around pillars and replacement metal gate structure. The multi-channel replacement metal gate device thus combines both FDSOI and fin device strengths. For example, in the FDSOI, a bottom channel can undergo Vt tuning by back gate bias; whereas, in the fin device, the sidewall channel exhibits significant current drive capability. Moreover, in the FDSOI, it is possible to have full turn off and, hence, improved short channel control. Also, absent the bulk junction, it is possible to obtain very low drain junction leakage (Ijct) and junction capacitance (Jct). Further, using an undoped channel, there is less process variation which enables Vdd scaling at a same gate overdrive. And due to back gate bias, there is much more flexibility for variable (programmable) Vt control.

The multi-channel replacement metal gate device of the present disclosure can be manufactured in a number of ways using a number of different tools. In general, though, the methodologies and tools are used to form structures with dimensions in the micrometer and nanometer scale. The methodologies, i.e., technologies, employed to manufacture the multi-channel replacement metal gate device of the present disclosure have been adopted from integrated circuit (IC) technology. For example, the structures are built on wafers and are realized in films of material patterned by photolithographic processes on the top of a wafer. In particular, the fabrication of the multi-channel replacement metal gate device uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
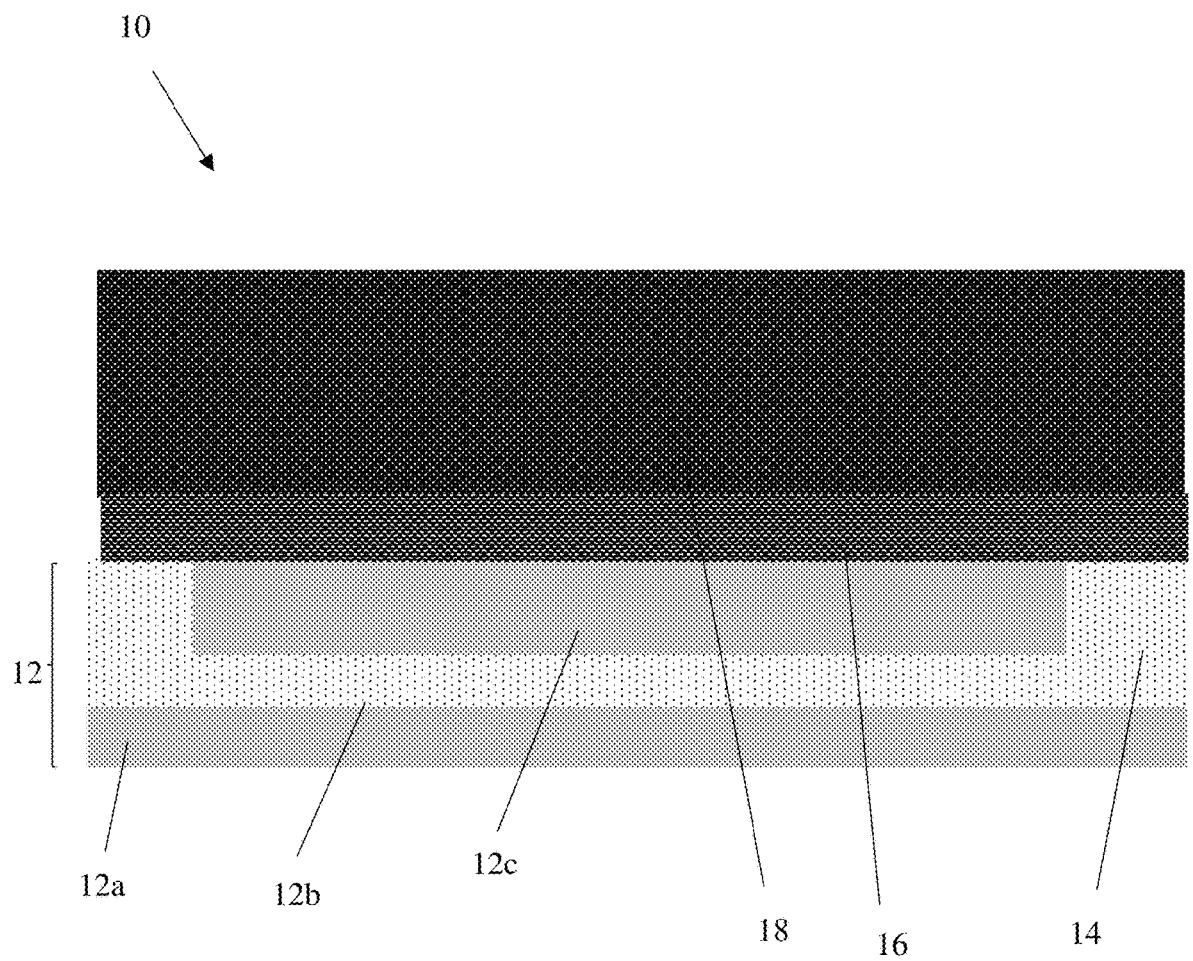
FIG. 1 shows a cross-sectional view of a substrate structure and respective fabrication processes in accordance with aspects of the present disclosure.

FIG. 1 shows a cross-sectional view of a substrate structure and respective fabrication processes in accordance with aspects of the present disclosure. In particular, the structure 10 of FIG. 1 includes a semiconductor on insulator substrate 12. Specifically, the semiconductor on insulator substrate 12 includes, from bottom to top, a handle substrate 12a, a buried insulator layer 12b and a semiconductor layer 12c. The handle substrate 12a provides mechanical support to the buried insulator layer 12b and the semiconductor layer 12c.

The handle substrate 12a and the semiconductor layer 12c may include fully depleted semiconductor material such as, for example, Si, SiGe, SiC, SiGeC, a III-V compound semiconductor, II-VI compound semiconductor or any combinations thereof. In this way, the channel region of a device will comprise fully depleted semiconductor material. In further embodiments, the handle substrate 12a and the semiconductor layer 12c comprise a single crystalline semiconductor material such as, for example, single crystalline silicon. The buried insulator layer 12b may include a dielectric material such as silicon dioxide, silicon nitride, silicon oxynitride, boron nitride or a combination thereof. In a preferred embodiment, the buried insulator layer 12b may be a buried oxide layer (BOX).

Still referring to FIG. 1, shallow trench isolation structures 14 may be provided within the substrate 12 and, preferably extending to the buried insulator layer 12b. In embodiments, the shallow trench isolation structures 14 may extend beyond the buried insulator layer 12b and into the handle substrate 12a.

The shallow trench isolation structures 14 may be formed by conventional lithography, etching and deposition methods known to those of skill in the art. For example, a resist formed over the semiconductor layer 12c is exposed to energy (light) to form a pattern (opening). An etching process with a selective chemistry, e.g., reactive ion etching (RIE), will be used to transfer the pattern into the semiconductor layer 12c through the openings of the resist. Following the resist removal by a conventional oxygen ashing process or other known stripants, insulator material (e.g., $SiO_2$) can be deposited by any conventional deposition processes, e.g., chemical vapor deposition (CVD) processes. Any residual material on the surface of the semiconductor layer 12c can be removed by conventional chemical mechanical polishing (CMP) processes.

A buffer layer 16 may be formed on the semiconductor layer 12c and over the shallow trench isolation structures 14. In embodiments, the buffer layer 16 may be a material that is different from the semiconductor layer 12c in order to provide etch selectivity in subsequent fabrication processes. For example, the buffer layer 16 may be SiN, SiGe, TiN, etc., deposited by a conventional deposition method, e.g., CVD. A polysilicon material 18 may be formed on the buffer layer 16. In embodiments, the polysilicon material 18 may be blanket deposited on the buffer layer 16 using conventional deposition methods, e.g., CVD processes.

Figure 2A:
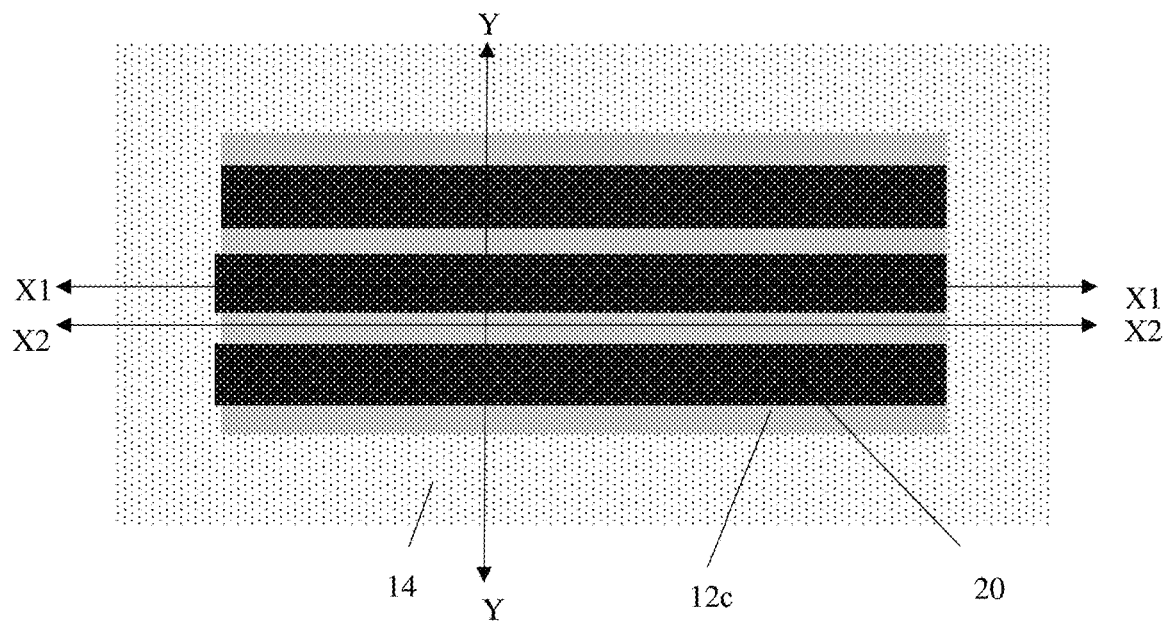
FIG. 2A is a top view of fin structures and respective fabrication processes in accordance with aspects of the present disclosure.
Figure 2B:
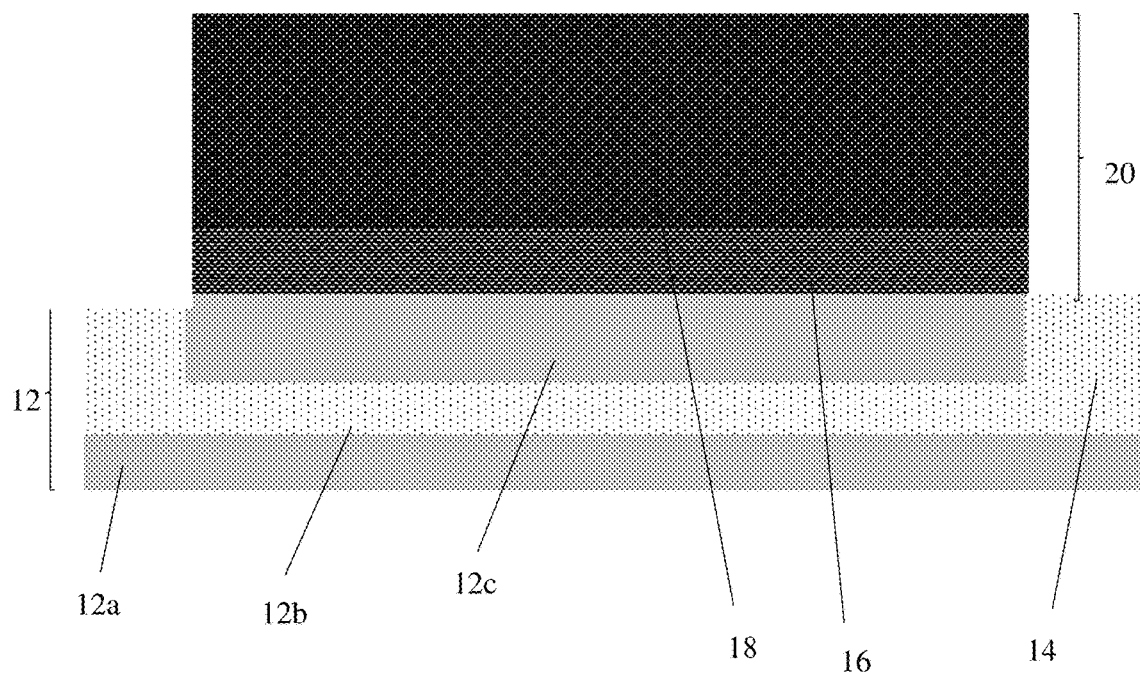
FIG. 2B is a cross-sectional view of the structure of FIG. 2A along line X1-X1.
Figure 2C:
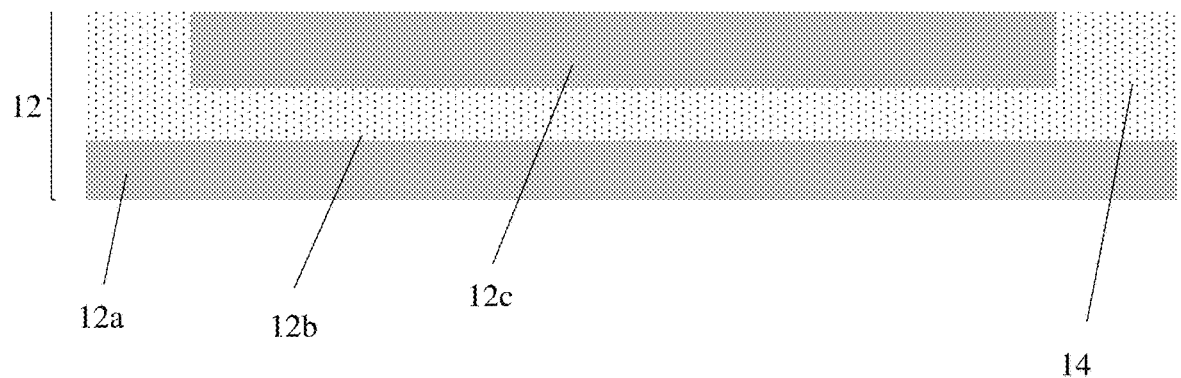
FIG. 2C is a cross-sectional view of the structure of FIG. 2A along line X2-X2.
Figure 2D:
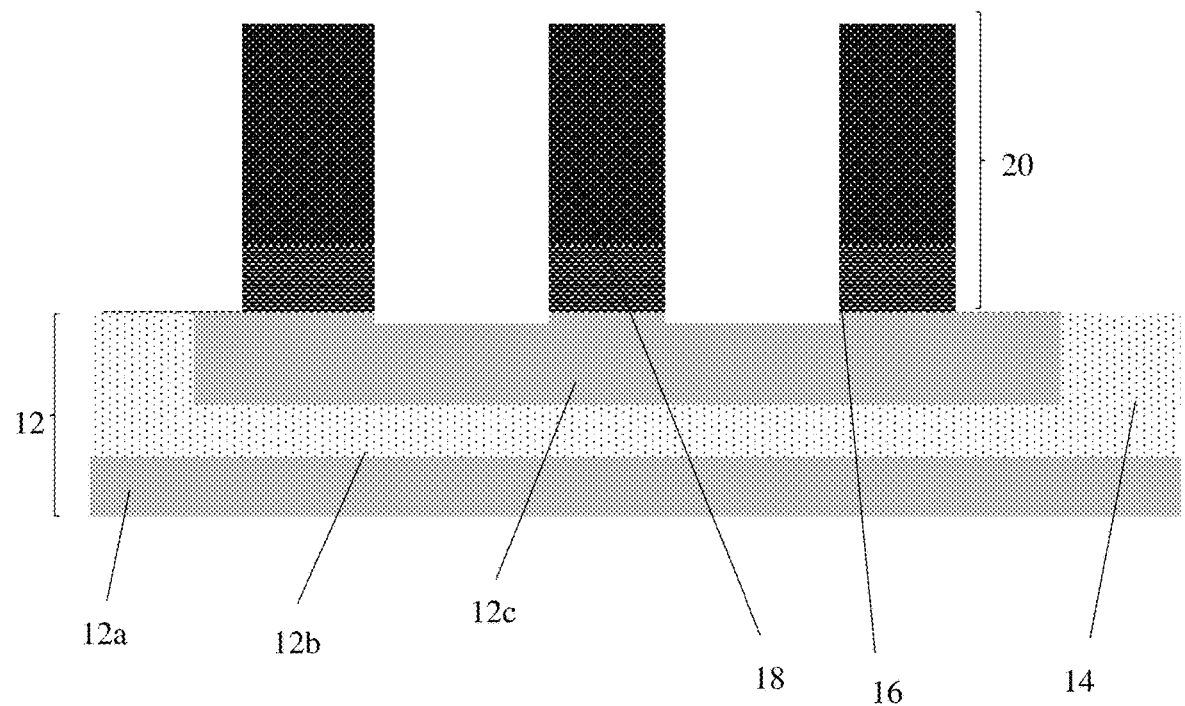
FIG. 2D is a cross-sectional view of the structure of FIG. 2A along line Y-Y.

FIG. 2A is a top view of fin structures and respective fabrication processes. FIG. 2B is a cross-sectional view of the structure of FIG. 2A along line X1-X1. FIG. 2C is a cross-sectional view of the structure of FIG. 2A along line X2-X2. FIG. 2D is a cross-sectional view of the structure of FIG. 2A along line Y-Y. Referring to FIGS. 2A-2D, fin structures 20 may be formed over the semiconductor layer 12c, from the polysilicon material 18 and the buffer layer 16. In embodiments, the fin structures 20 may be formed using conventional lithography and etching processes, stopping on the semiconductor layer 12c. For example, the lithography and etching processes may be conventional sidewall image transfer (SIT) techniques, self-aligned double patterning (SADP) techniques, or other known fin patterning processes known to those of skill in the art such that no further explanation is required for a complete understanding of the present disclosure. As shown in FIGS. 2A, 2C and 2D, a top surface of the semiconductor layer 12c may be exposed between and on sides of the fin structures 20.

Figure 3A:
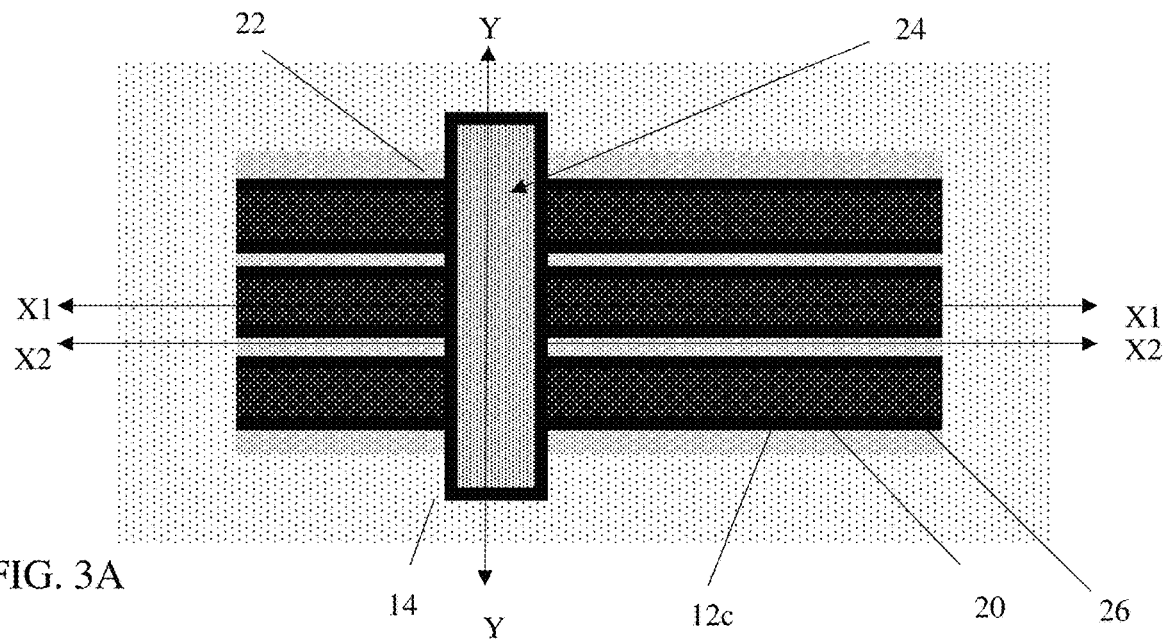
FIG. 3A is a top view of a dummy gate structure spanning over the fin structures and respective fabrication processes in accordance with aspects of the present disclosure.
Figure 3B:
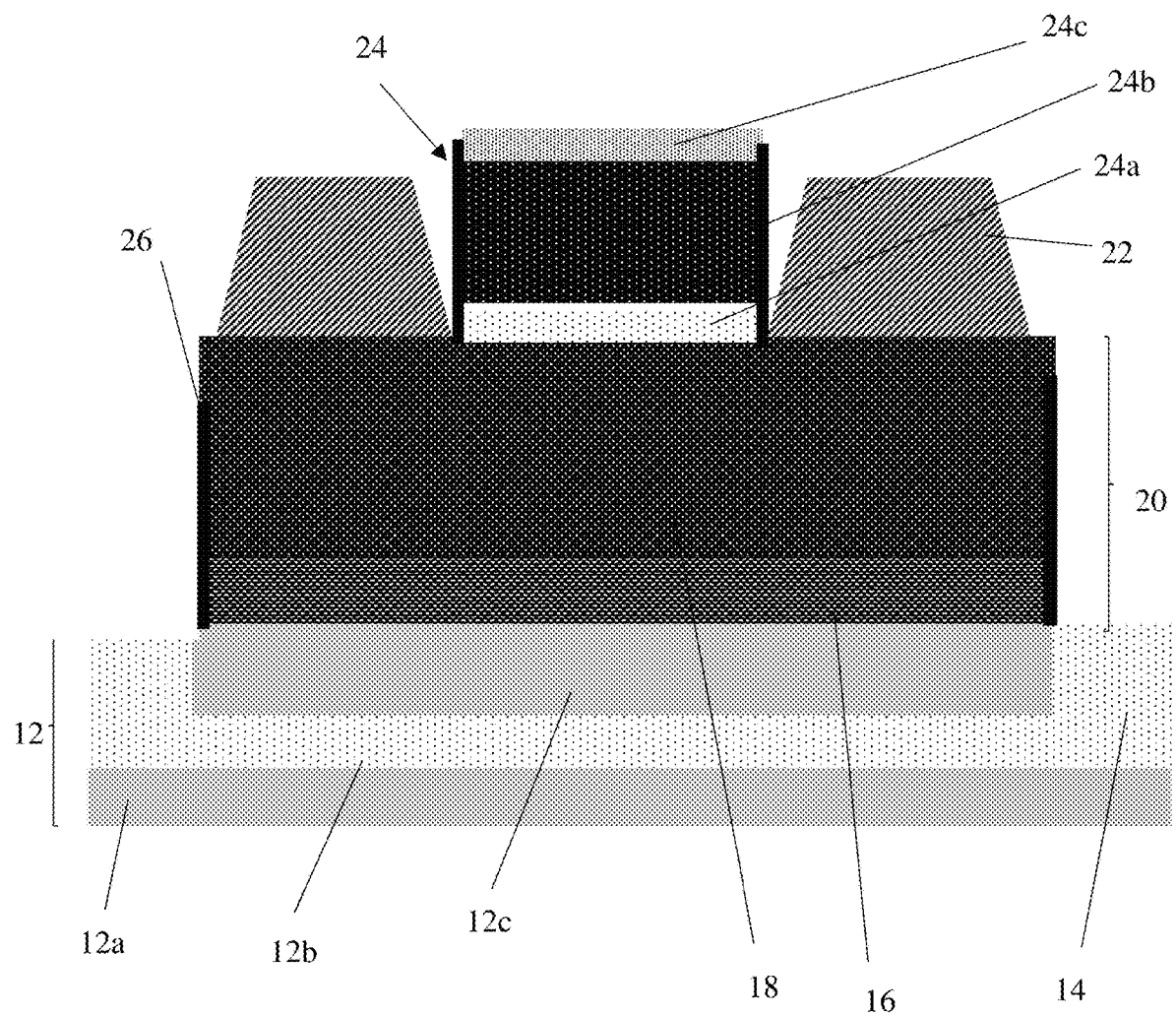
FIG. 3B is a cross-sectional view of the structure of FIG. 3A along line X1-X1.
Figure 3C:
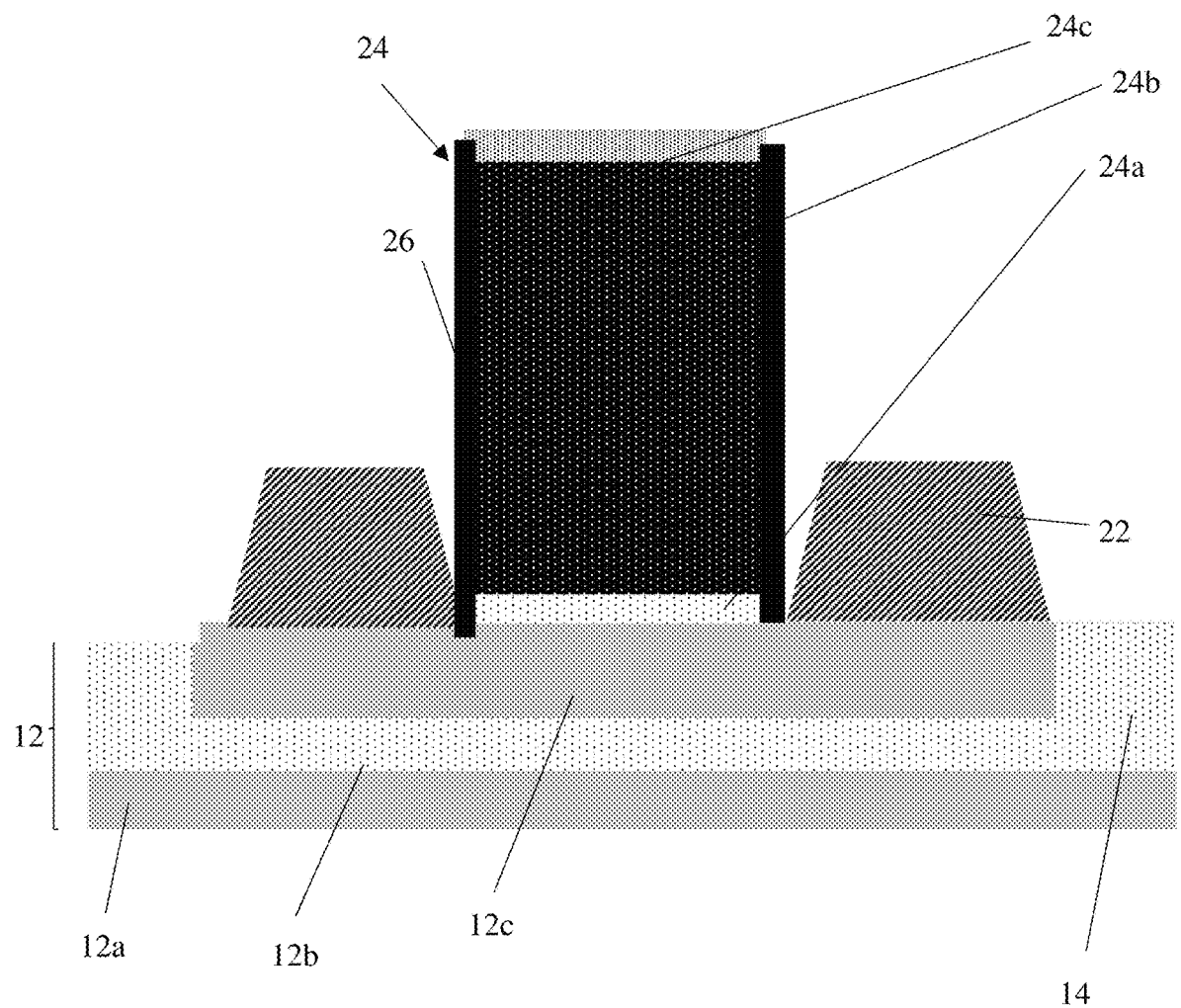
FIG. 3C is a cross-sectional view of the structure of FIG. 3A along line X2-X2.
Figure 3D:
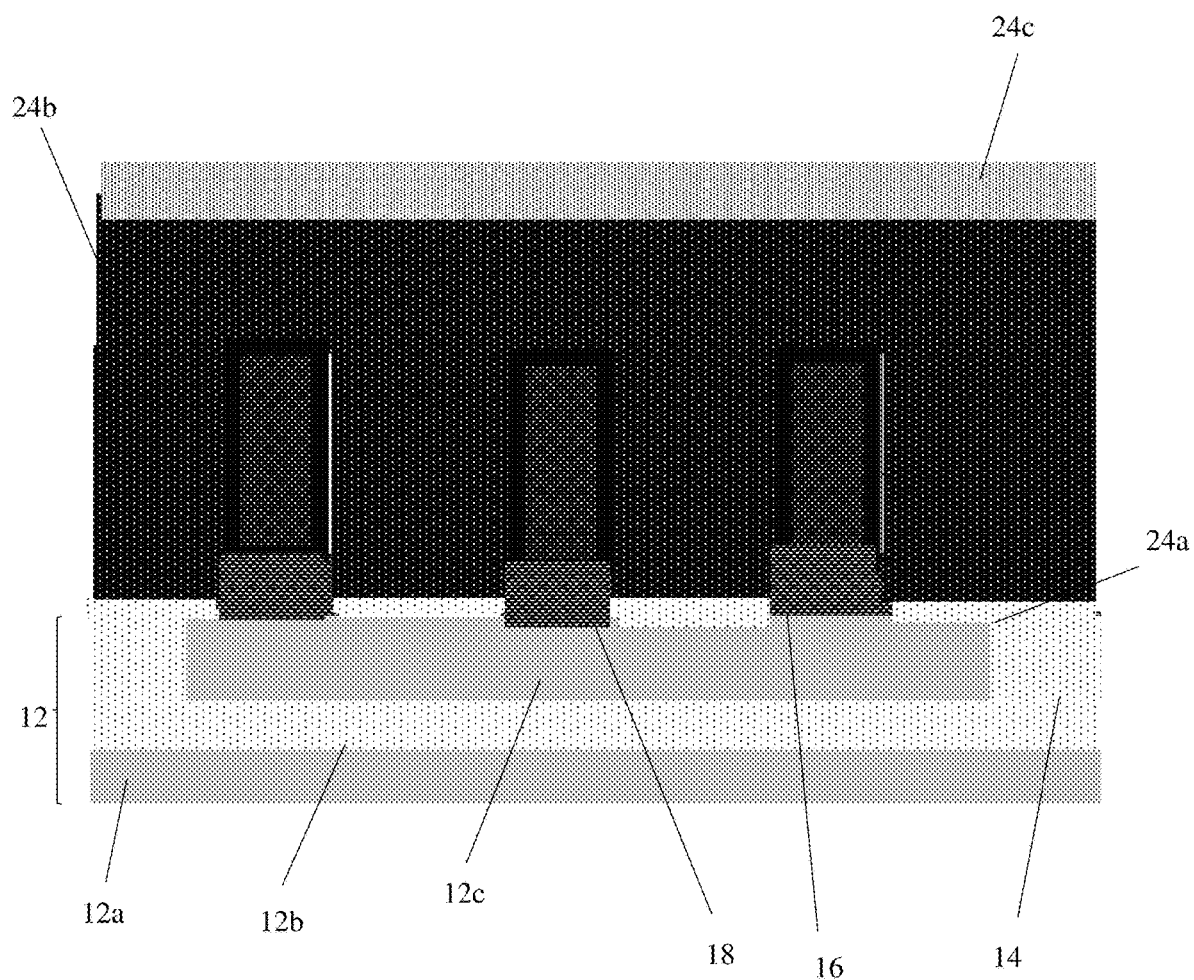
FIG. 3D is a cross-sectional view of the structure of FIG. 3A along line Y-Y.

FIG. 3A shows a top view of a dummy gate structure spanning over multiple fin structures 20 and respective fabrication processes. FIG. 3B is a cross-sectional view of the structure of FIG. 3A along line X1-X1. FIG. 3C is a cross-sectional view of the structure of FIG. 3A along line X2-X2. FIG. 3D is a cross-sectional view of the structure of FIG. 3A along line Y-Y. Referring to FIGS. 3A-3D, a dummy gate structure 24 may be formed over the fin structures 20 and, more particularly, on the polysilicon material 18 of the fin structures 20. More specifically, the dummy gate structure 24 extends over multiple fin structures 20.

In embodiments, the dummy gate structure 24 may comprise, for example, a sacrificial gate dielectric material 24a, a sacrificial dummy gate material 24b (e.g., polysilicon material) and a sacrificial capping material 24c. In embodiments, the sacrificial gate dielectric material 24a may be an oxide material and the sacrificial capping material 24c may be a nitride hardmask as an example. The sacrificial dummy gate structure 24 may be formed by conventional deposition processes comprising the gate dielectric material 24a, dummy gate material 24b (e.g., polysilicon material) and capping material 24c, following by patterning processes, e.g., conventional lithography and etching processes.

Sidewall spacers 26 may be formed on sidewalls of the dummy gate structure 24 and the fin structures 20. The sidewall spacers 26 may comprise SiN, SiCoH or other low-k dielectric material. The sidewall spacers 26 may be formed by a conventional deposition process, followed by an anisotropic etching process known to those of skill in the art. As should be understood by those of skill in the art, the anisotropic etching process includes a lateral etching component that etches the material of the sidewall spacers 26 on horizontal surfaces. In embodiments, the etching process may also slightly recess the sidewall spacers to below a top surface of the sacrificial capping material 24c and the fin structures 20. As shown in FIG. 3A, the sidewall spacers 26 will completely surround the dummy gate structure 24.

As shown in FIGS. 3A, 3B and 3C, epitaxial regions 22 are formed on sides of the dummy gate structure 24, e.g., on the exposed semiconductor layer 12c and the fin structures 20, e.g., polysilicon material 18 of the fin structures 20. In embodiments, the epitaxial regions 22 (e.g., raised source/drain regions) are formed by selectively growing a semiconductor material on the exposed semiconductor layer 12c and the polysilicon material 18 of the fin structures 20. In accordance with exemplary embodiments, the epitaxial regions 22 may include different doped materials depending on device application, e.g., p-type or n-type devices. For example, SiGe doped with boron (SiGeB) may be grown for a p-type device; conversely, silicon phosphorous (SiP) or silicon carbon phosphorous (SiCP) may be grown for an n-type device. In accordance with embodiments of the present disclosure, the dopants are in-situ doped with the p-type or n-type impurity during the epitaxial growth process. An annealing process may be performed to drive in the dopants.

Figure 4A:
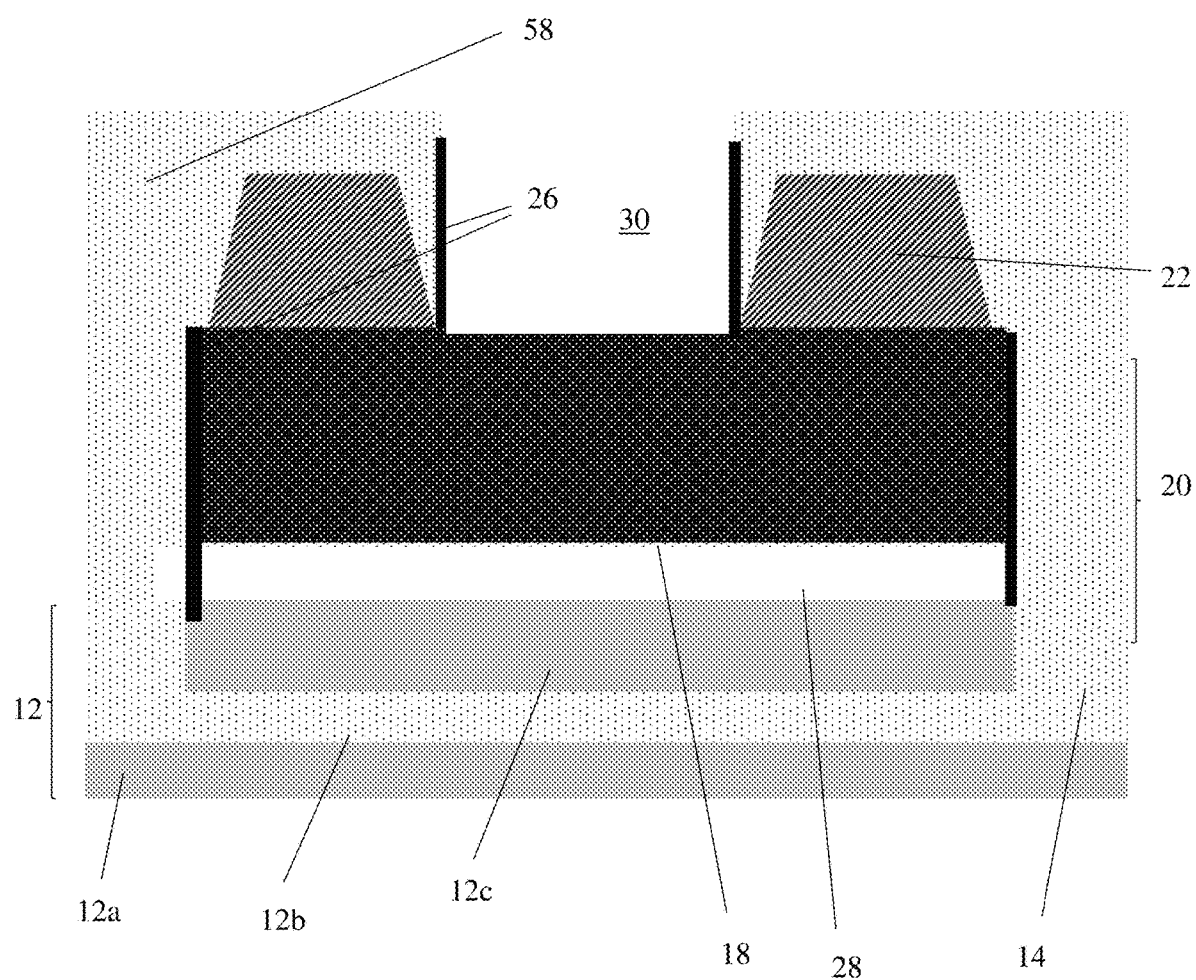
FIGS. 4A-4C are several cross-sectional views showing removal of the dummy gate structure, amongst other features, and respective fabrication processes in accordance with aspects of the present disclosure.
Figure 4B:
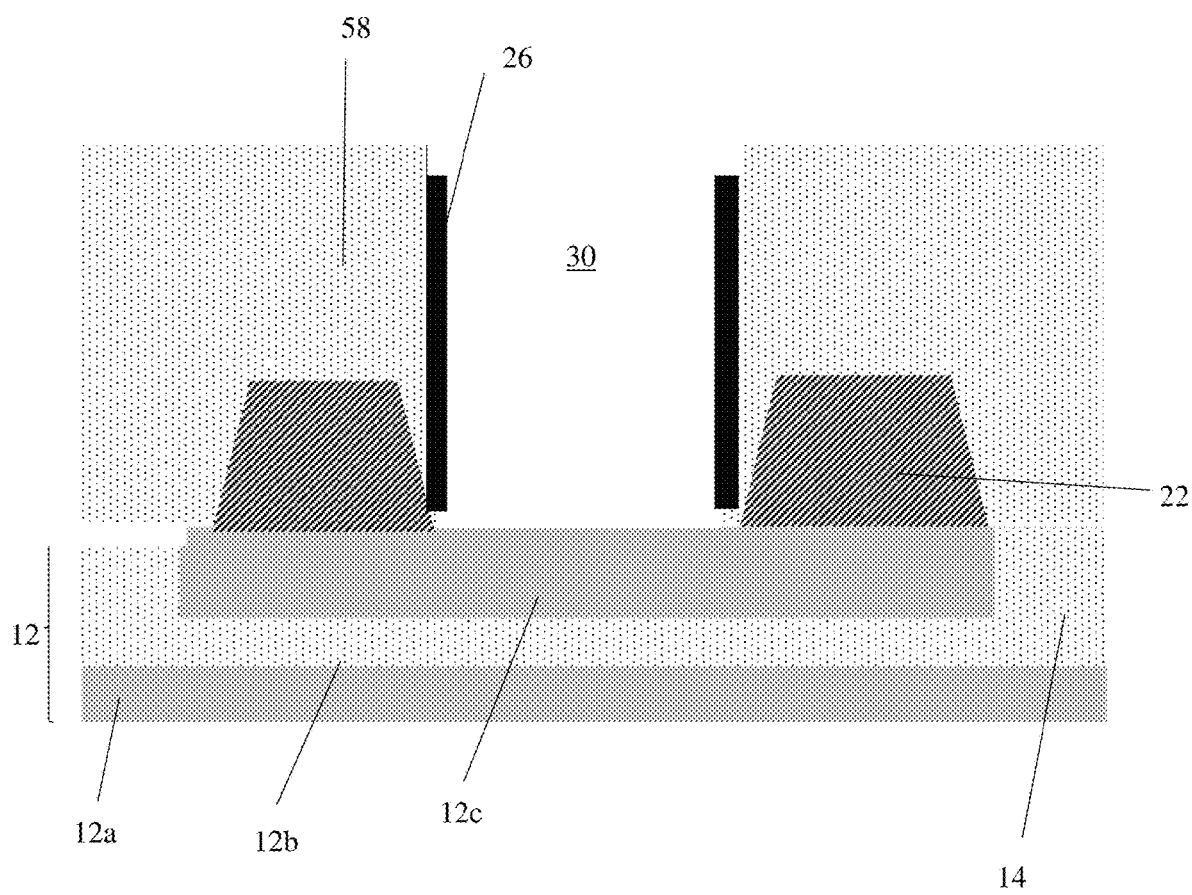
Figure 4C:
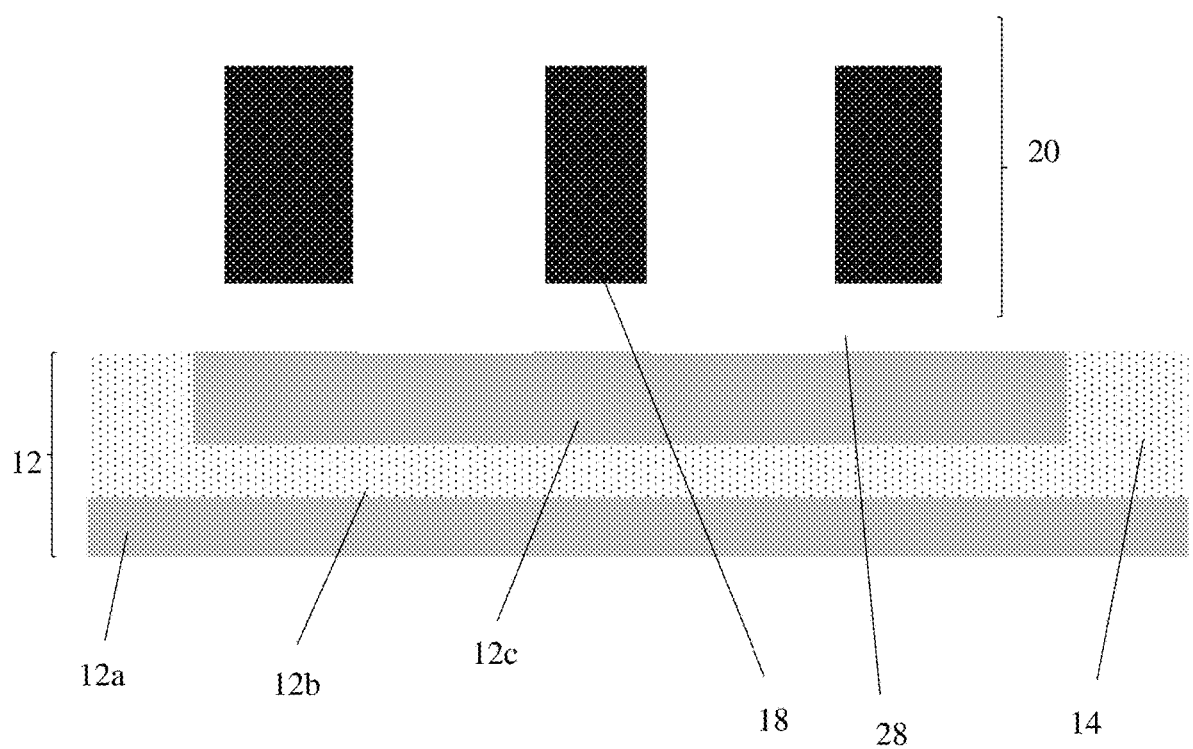

FIGS. 4A-4C are different cross-sectional views showing floating fin structures and removal of the dummy gate structure. As shown in FIGS. 4A-4C, an interlevel dielectric material 58 may be formed on the structure using, e.g., CVD processes and a chemical mechanical polishing (CMP). In embodiments, the interlevel dielectric material 58 may be oxide and/or nitride material as is known in the art.

As shown in FIGS. 4A and 4B, the dummy gate structure 24 may be removed to form a space 30 between the sidewall spacers 26 using selective chemistries to the materials 24a, 24b, 24c. The buffer layer 16 may also be removed under the fin structure 20 to form a void 28. In this way, the fin structures are floating fin structures. In embodiments, the buffer layer 16 may be removed using a selective chemistry used for the removal of the sacrificial gate dielectric material 24a, for example. In this way, as shown in FIG. 4C, the fin structures 20 now comprise the polysilicon material 18 which float above the semiconductor layer 12c.

Figure 5A:
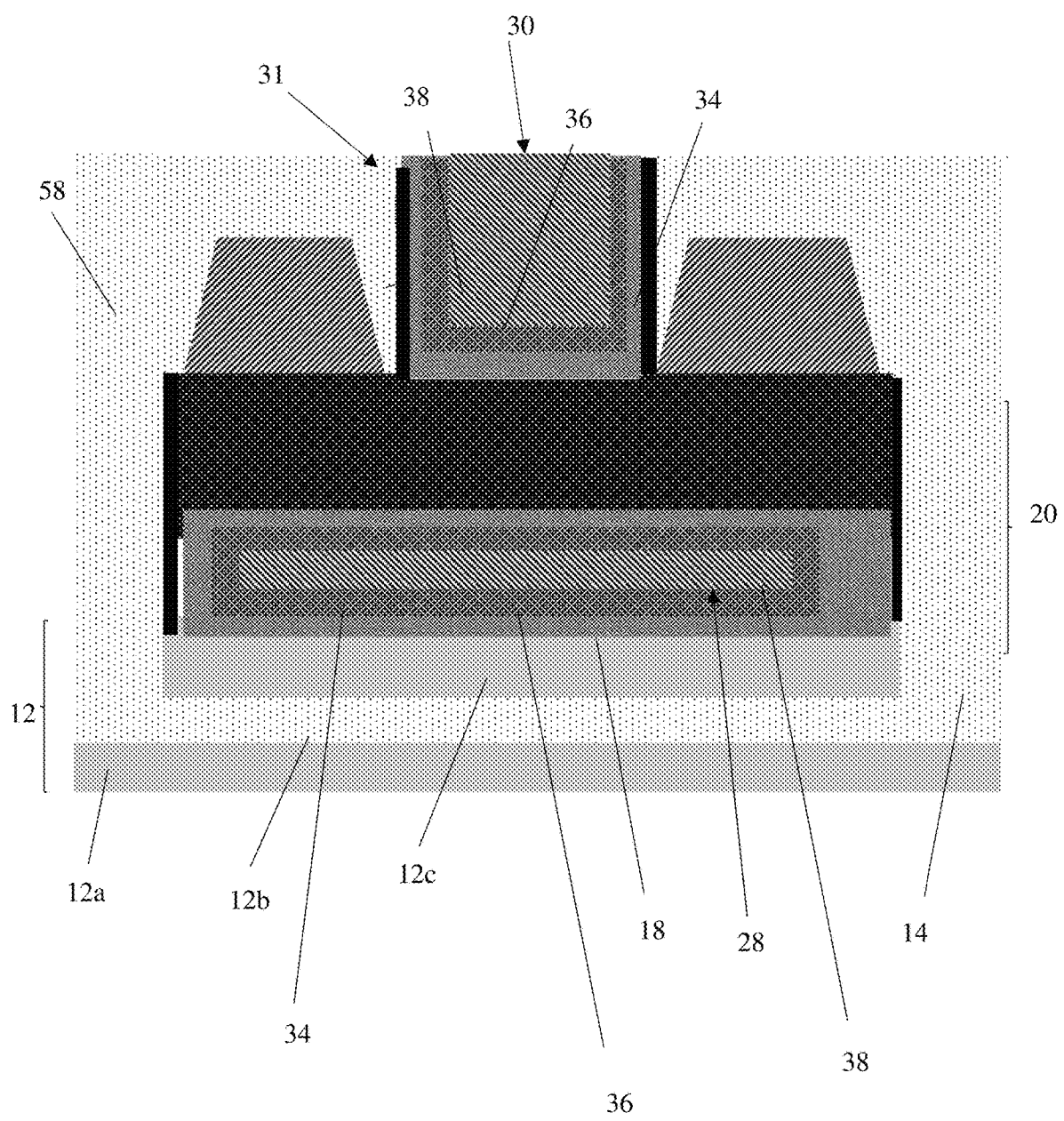
FIGS. 5A-5C are several cross-sectional views showing a replacement metal gate structure surrounding floating fin structures, and respective fabrication processes in accordance with aspects of the present disclosure.
Figure 5B:
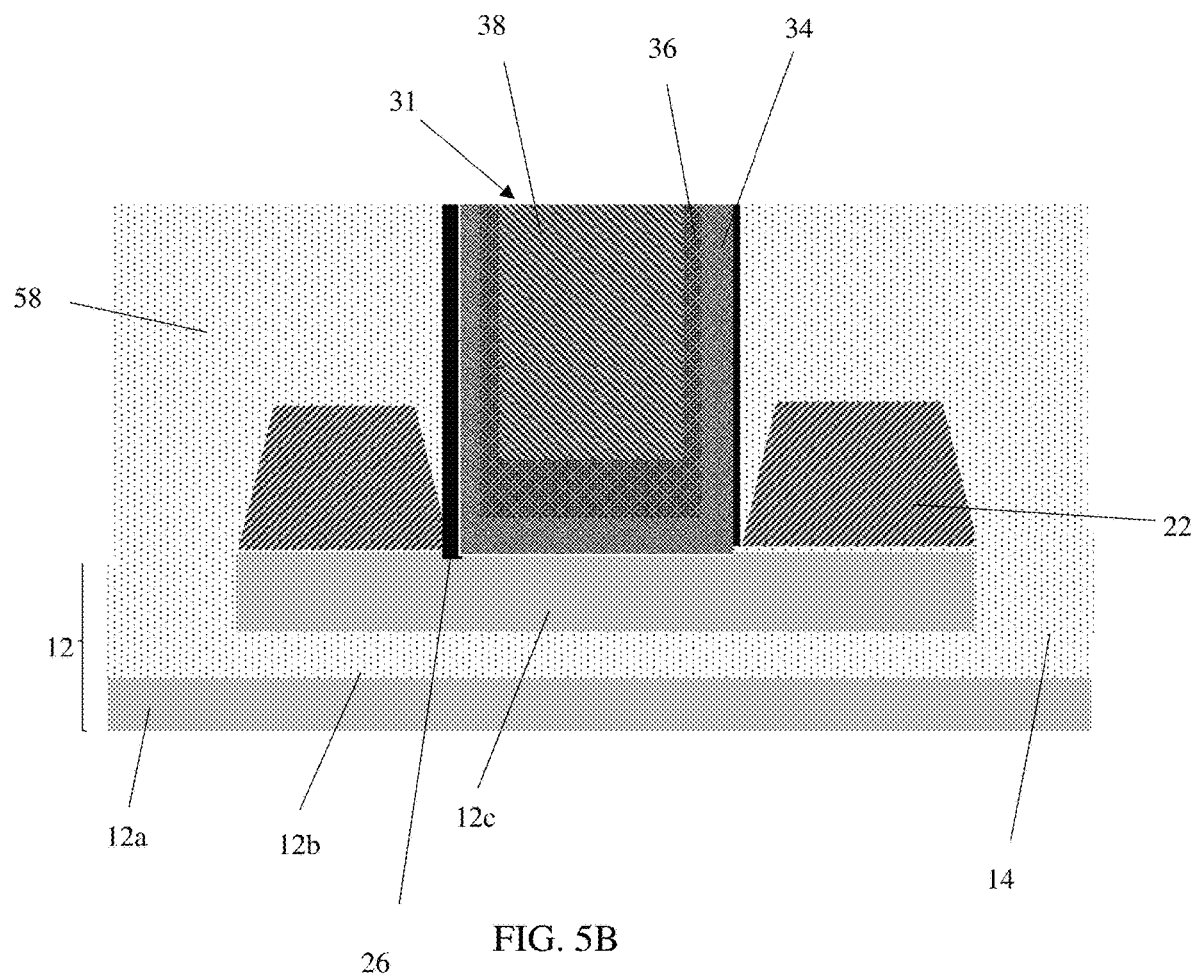
Figure 5C:
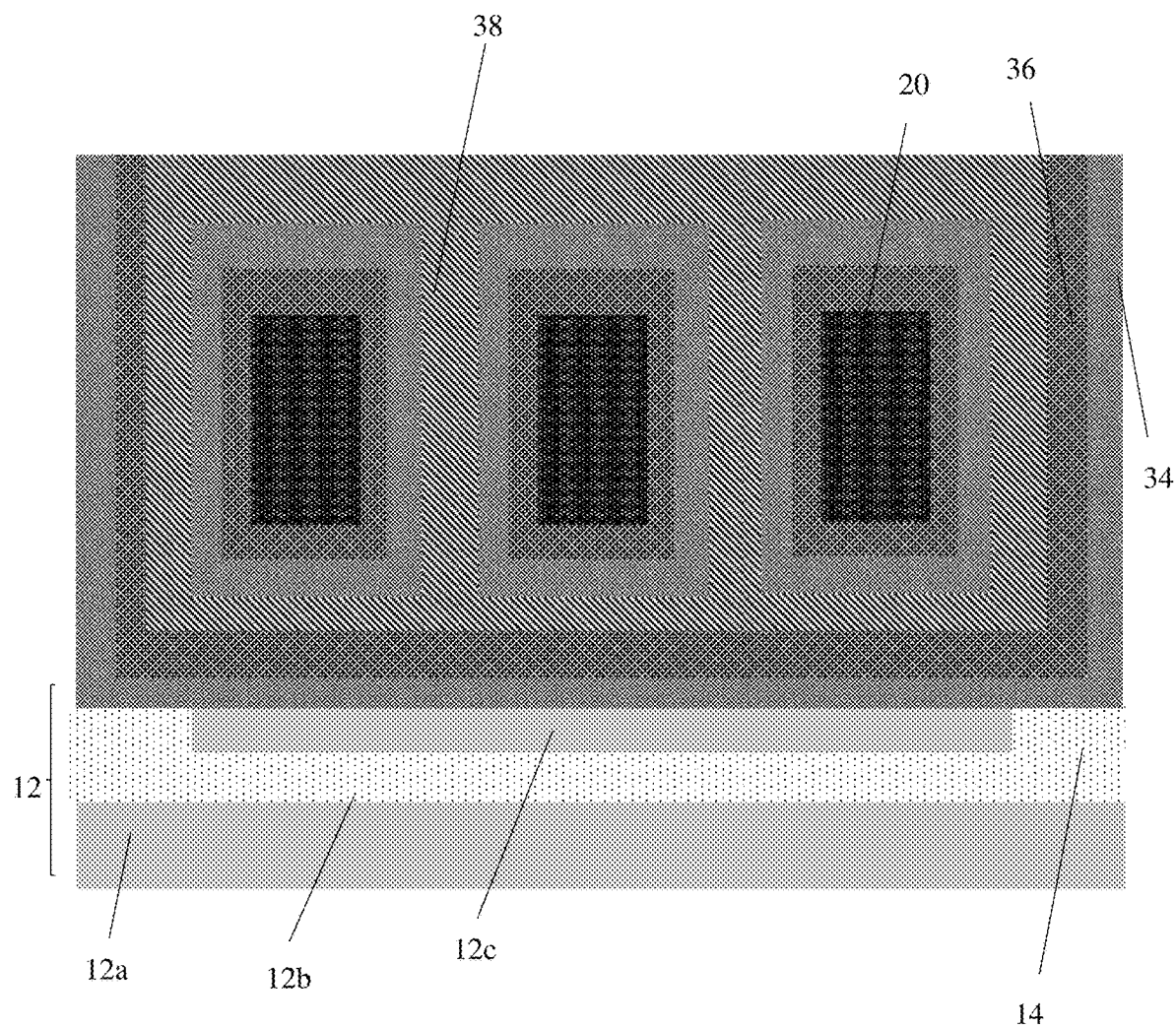

FIGS. 5A-5C are different cross-sectional views showing a replacement metal gate structure 31 above and surrounding the floating fin structures 20. As shown in FIGS. 5A-5C, gate materials 34, 36, 38 are formed within the space 30 and void 28, effectively surrounding the fin structures 20. Accordingly, as should be understood by those of skill in the art, the replacement gate metal structure 31 surrounds, e.g., extends over and underneath, the multiple fin structures 20 and is at least partially within the sidewall spacers 26. And as thus shown in FIG. 5C, for example, the gate material 34 lines (e.g., wraps around) the floating gate structures 20, in addition to the gate materials 36, 38 over the gate material 34 to form multiple standing gate all around pillars. Moreover, the replacement gate metal structure 31 includes channels comprising fully depleted semiconductor material, e.g., fully depleted semiconductor layer 12c.

In embodiments, the gate material 34 may be gate dielectric material. For example, the gate dielectric material 34 may be a high-k gate dielectric material such as, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 34 may be deposited by atomic layer deposition (ALD). The gate material 36 may be workfunction metals, e.g., for a p-FET device or n-FET device. For example, the workfunction metals may include Ti, TiAlC, Al, TiAl, TaN, TaAlC, TiN, TiC and Co, amongst other materials. The gate material 36 may be deposited by CVD, physical vapor deposition (PVD) including sputtering, ALD or other suitable method. Also, as shown in FIGS. 6A and 6B, the gate dielectric material 34 and the workfunction metals 36 may be U-shaped, with the gate dielectric material 34 on the sidewall spacer 26.

The gate material 38 may be a gate electrode, e.g., tungsten. The gate materials 34, 36, 38, may undergo a CMP process to remove these material from a surface of the interlevel dielectric material 58, thereby forming a planar surface with the interlevel dielectric material 58.

Figure 6A:
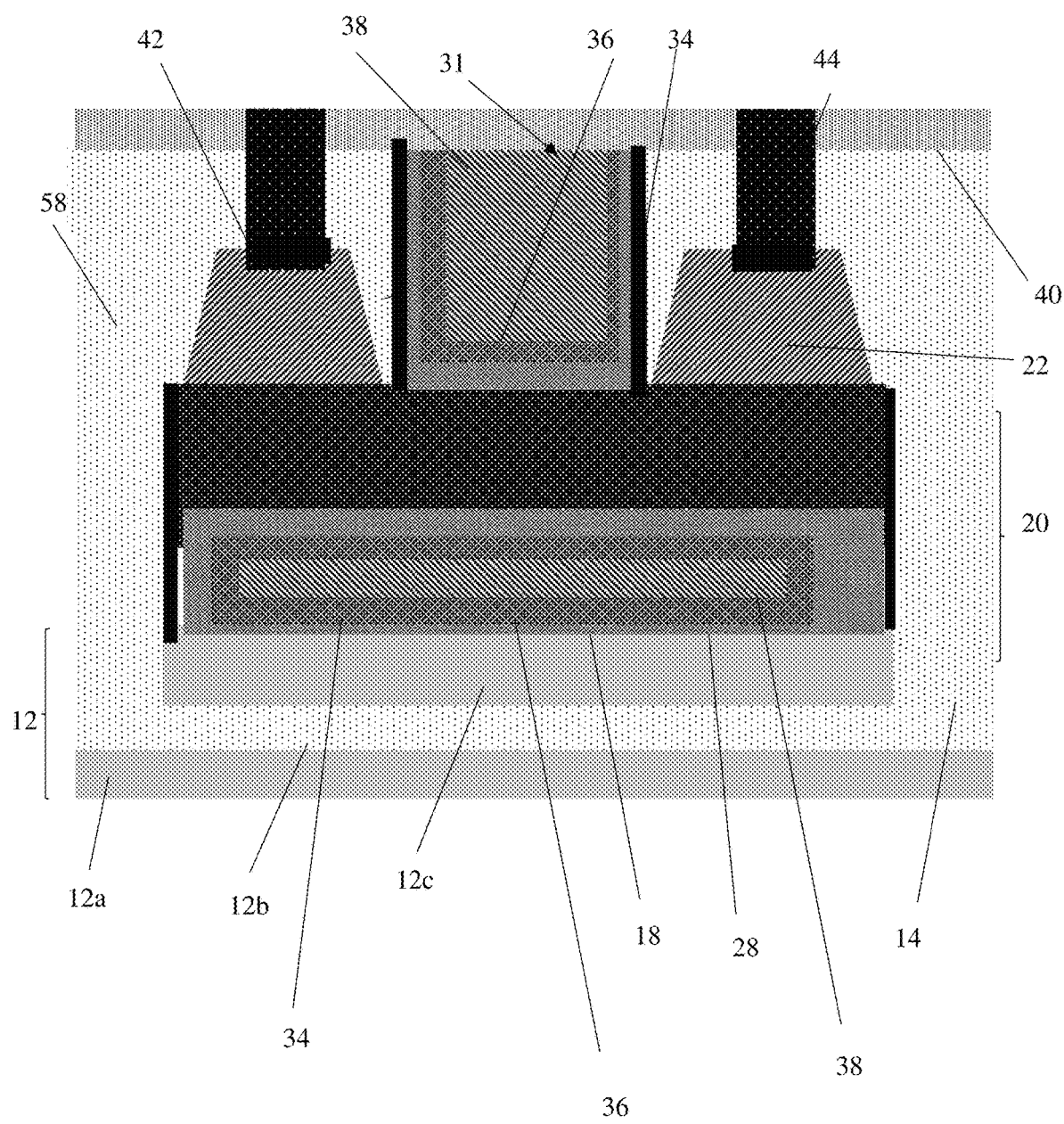
FIGS. 6A-6C are several cross-sectional views showing contacts to source/drain regions and respective fabrication processes in accordance with aspects of the present disclosure.
Figure 6B:
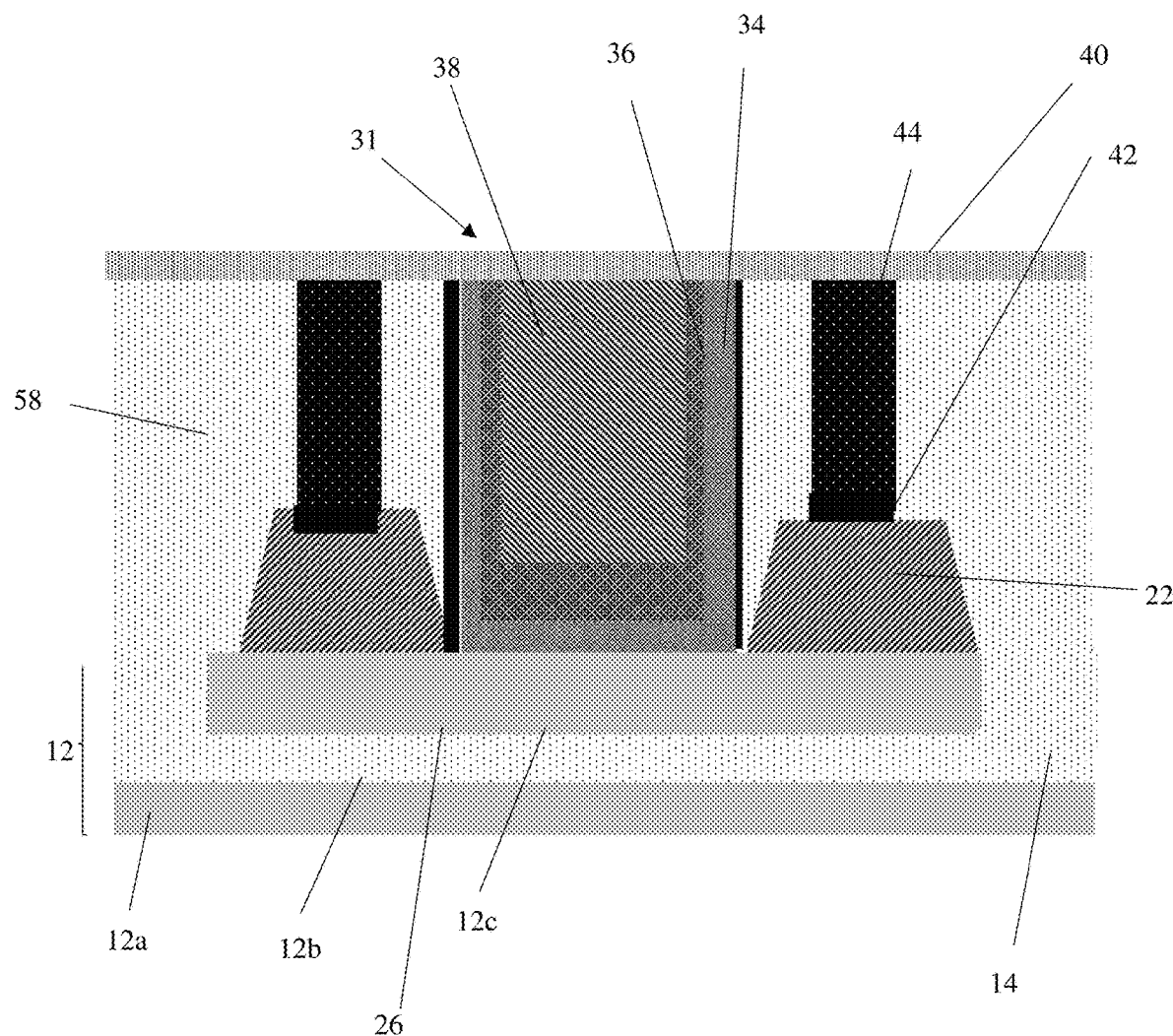
Figure 6C:
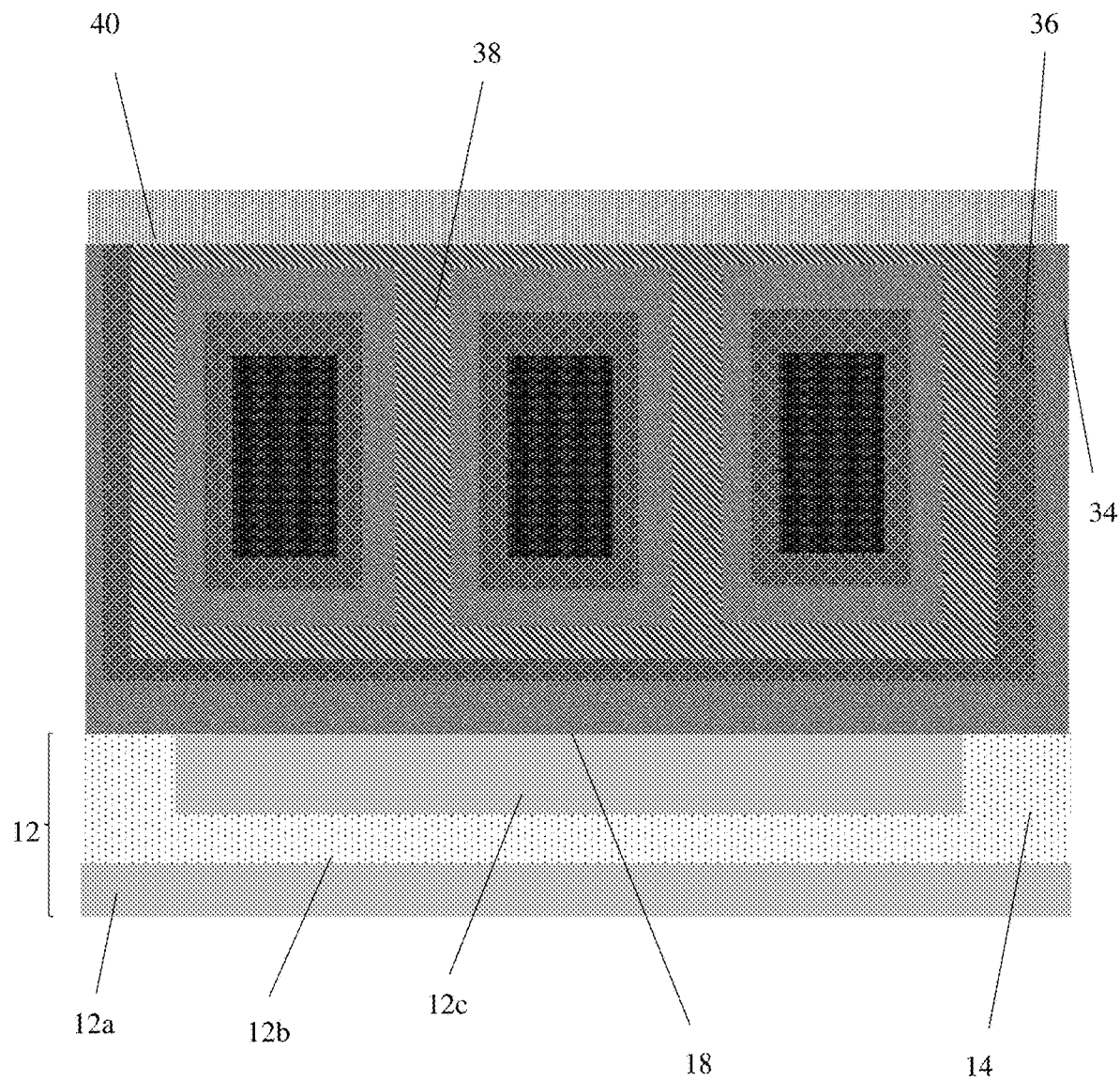

FIGS. 6A-6C are different cross-sectional views showing contacts to the source/drain regions. More specifically, in embodiments, a middle of the line material 40 may be deposited on the gate materials 34, 36, 38 and the interlevel dielectric material 58. The middle of the line material 40 may be nitride, deposited by a CVD process. A trench is formed within the middle of the line material 40 and the interlevel dielectric material 58 to expose the epitaxial regions 22 (e.g., source/drain regions).

A silicide contact 42 is formed on the epitaxial regions 22. As should be understood by those of skill in the art, the silicide process begins with deposition of a thin transition metal layer, e.g., nickel, cobalt or titanium, over fully formed and patterned semiconductor devices (e.g., epitaxial regions 22). After deposition of the material, the structure is heated allowing the transition metal to react with exposed silicon (or other semiconductor material as described herein) in the active regions of the semiconductor device (e.g., epitaxial regions 22) forming a low-resistance transition metal silicide. Following the reaction, any remaining transition metal is removed by chemical etching, leaving silicide contacts 42 in the active regions of the device. It should be understood by those of skill in the art that silicide contacts will not be required on the metal gate structures.

Still referring to FIGS. 6A-6C, contacts 44 may be formed to the epitaxial regions 22 and, more specifically, on the silicide contacts 42 of the epitaxial regions 22. In embodiments, the contacts 44 may be tungsten material with a barrier liner material as should be understood by those of skill in the art. The contacts 44 may be formed by a conventional deposition method, e.g., CVD, followed by a CMP process to remove any excess material from the material 40.

Figure 7A:
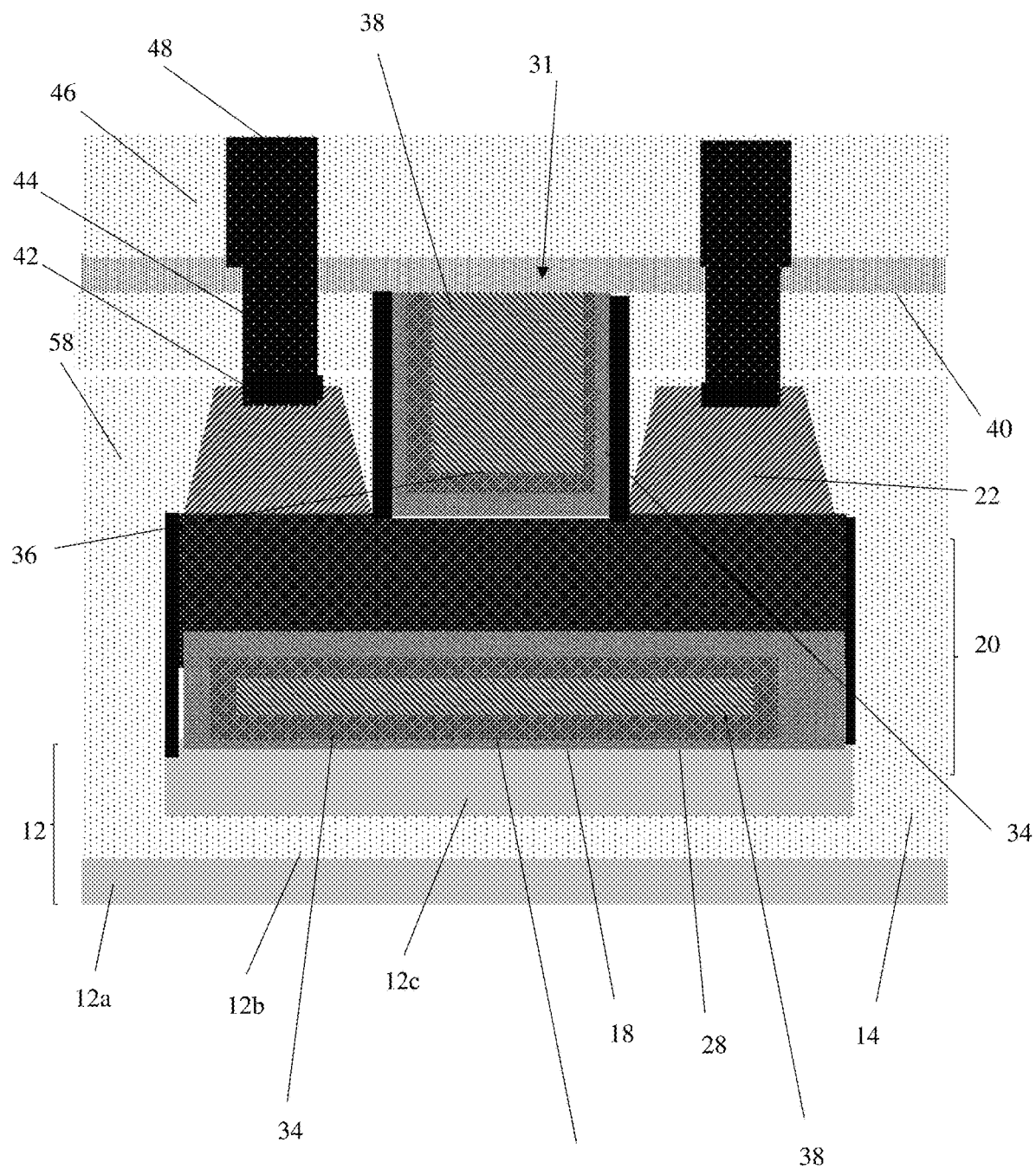
FIGS. 7A-7C are several cross-sectional views showing contacts to the replacement metal gate structure and the contacts of the source/drain regions, and respective fabrication processes in accordance with aspects of the present disclosure.
Figure 7B:
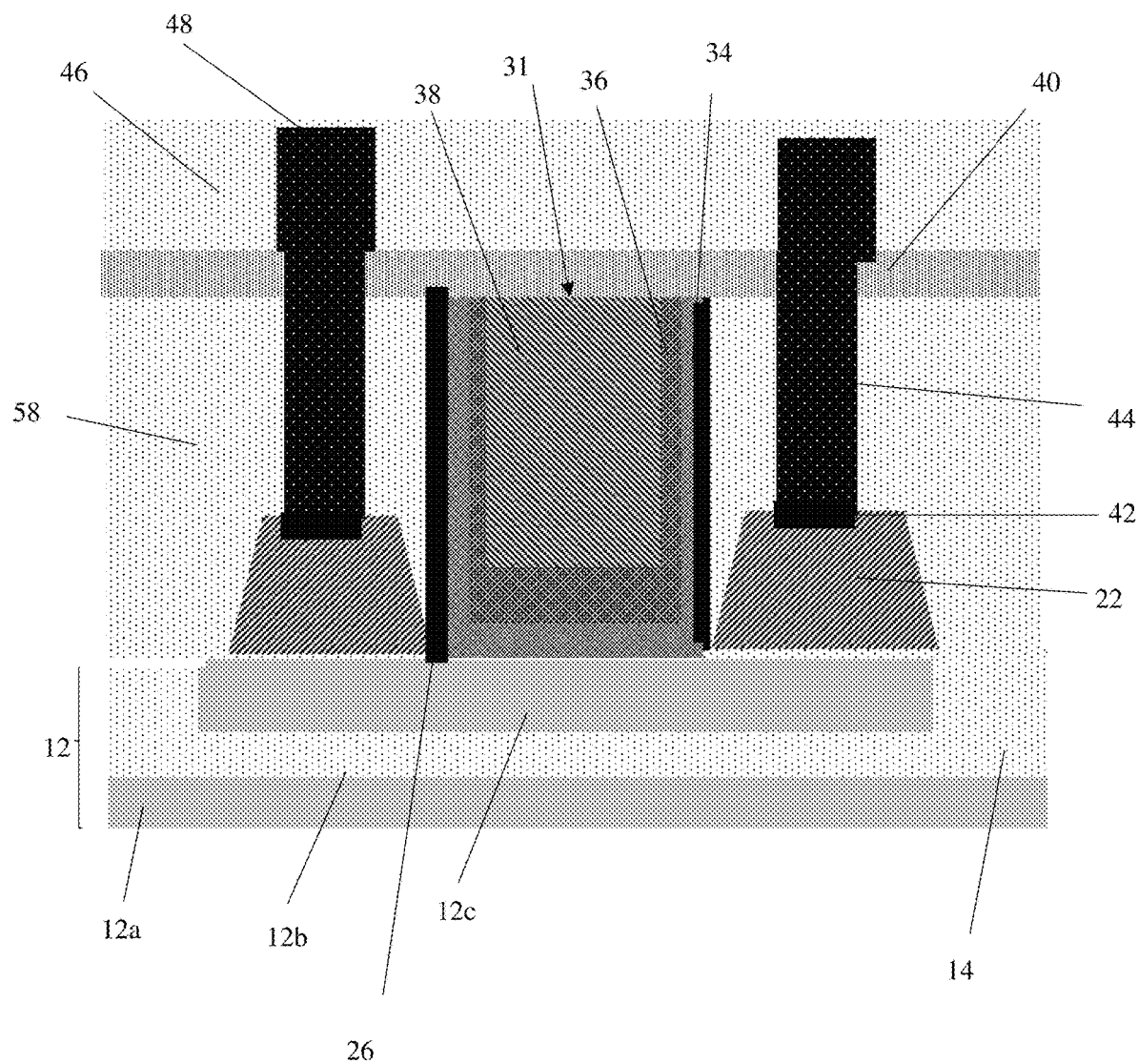
Figure 7C:
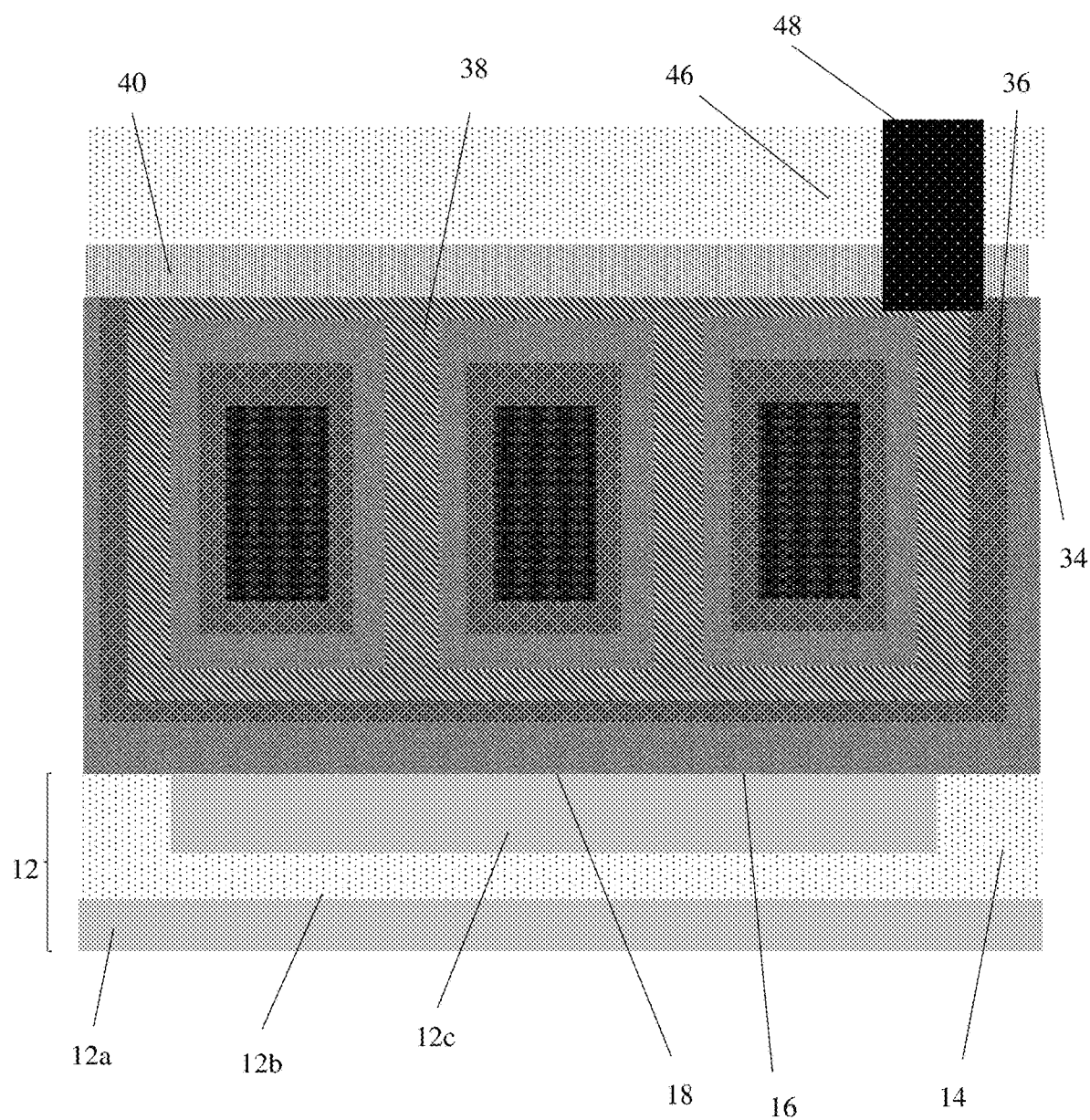

FIGS. 7A-7C are cross-sectional views showing contacts to the replacement metal gate structure 31 and the contacts 44 of the epitaxial regions 22 (e.g., source/drain regions). In particular, an interlevel dielectric material 46 may be formed (e.g., deposited) over the middle of the line material 40, with a trench formed within interlevel dielectric material 46 to expose the gate electrode 38 and the contacts 44. The trench may be formed using conventional lithography and etching processes as described herein and as is known to those of skill in the art. Contacts 48 may be formed within the trench to the exposed gate electrode 38 and the contacts 44. In embodiments, the contacts 48 may be aluminum, for example, with a liner of TiN or TaN. The contacts 48 may be deposited by a conventional CVD process followed by a CMP process.

The multi-channel replacement metal gate device can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a fully depleted semiconductor on insulator substrate;
a multi-channel transistor comprising a plurality of fin structures over the fully depleted semiconductor on insulator substrate, the fully depleted semiconductor on insulator substrate also being between the plurality of fin structures;
the multi-channel transistor further comprising a metal gate structure comprising a high-k gate dielectric material and a workfunction gate material spanning over the plurality of fin structures and the fully depleted semiconductor on insulator substrate; and
raised epitaxial diffusion regions adjacent to the plurality of fin structures.

2. The structure of claim 1, wherein the metal gate structure comprises a gate electrode confined at least partially within a sidewall spacer material above the plurality of fin structures.

3. The structure of claim 1, wherein the plurality of fin structures comprise a polysilicon material wrapped around by the high-k gate dielectric material and the workfunction material of the metal gate structure.

4. The structure of claim 3, wherein the plurality of fin structures are multiple standing gate all around pillars.

5. The structure of claim 1, wherein the raised epitaxial diffusion regions comprise raised source and drain regions comprising a semiconductor material.

6. The structure of claim 1, wherein the raised epitaxial diffusion regions are on the plurality of fin structures and the fully depleted semiconductor on insulator substrate.

7. The structure of claim 1, wherein the plurality of fin structures comprise a plurality of floating fin structures with the metal gate structure wrapped around the plurality of floating fin structures.

8. The structure of claim 7, wherein the gate material surrounding the plurality of fin structures separates the plurality of fin structures from the fully depleted semiconductor on insulator substrate.

9. A structure comprising a multi-channel transistor with multiple pillar channel regions above a semiconductor on insulator channel region,
wherein the multi-channel transistor comprises a high-k gate dielectric material and a workfunction gate material,
wherein the multiple pillar channel regions comprise fin structures wrapped with the high-k gate dielectric material and the workfunction gate material, and
wherein the semiconductor on insulator channel region comprises fully depleted semiconductor on insulator material underneath the fin structures.

10. The structure of claim 9, wherein the fin structures are floating fin structures.

11. The structure of claim 9, wherein the multi-channel transistor comprises a metal gate structure surrounding the fin structures, wherein the metal gate structure is confined within sidewall spacers above the fin structures.

12. A structure comprising a multi-channel transistor with multiple pillar channel regions above a semiconductor on insulator channel region,
wherein the multi-channel transistor comprises a high-k gate dielectric material and a workfunction gate material and the semiconductor on insulator channel region comprises a fully depleted semiconductor on insulator material,
wherein the multiple pillar channel regions comprise fin structures wrapped with the high-k gate dielectric material and the workfunction gate material, and
raised epitaxial regions on the fin structures, and the fully depleted semiconductor on insulator material between the fin structures.

13. The structure of claim 12, wherein the fin structures comprise a polysilicon material and the fully depleted semiconductor on insulator material is underneath the fin structures.

14. A method comprising:
forming a multi-channel transistor comprising a plurality of fin structures over a fully depleted semiconductor on insulator substrate, the fully depleted semiconductor on insulator substrate also being between the plurality of fin structures;
forming a metal gate structure comprising a high-k gate dielectric material and a workfunction gate material spanning over the plurality of fin structures and the fully depleted semiconductor on insulator substrate; and
forming raised epitaxial diffusion regions adjacent to the plurality of fin structures.

* * * * *